(12) United States Patent
Tang

(10) Patent No.: US 7,577,863 B2
(45) Date of Patent: Aug. 18, 2009

(54) ADDRESSING TYPE FREQUENCY COUNTER CIRCUIT

(75) Inventor: Di Tang, Taipei (TW)

(73) Assignee: Tatung Co., Ltd., Taipei (TW)

( * ) Notice: Subject to any disclaimer, the term of this patent is extended or adjusted under 35 U.S.C. 154(b) by 1060 days.

(21) Appl. No.: 11/135,356

(22) Filed: May 24, 2005

(65) Prior Publication Data

US 2005/0286677 A1 Dec. 29, 2005

(30) Foreign Application Priority Data

Jun. 15, 2004 (TW) .............................. 93117163 A

(51) Int. Cl.
*G06F 5/06* (2006.01)
*H04L 12/50* (2006.01)
*H03K 21/08* (2006.01)
(52) U.S. Cl. .......................... 713/600; 370/359; 377/56
(58) Field of Classification Search .................. 713/600
See application file for complete search history.

(56) References Cited

U.S. PATENT DOCUMENTS 4,303,989 A * 12/1981 Membrino et al. .......... 712/300
4,771,422 A * 9/1988 Hauer ......................... 370/359
5,291,526 A * 3/1994 Ichikawa et al. ............ 375/362
5,669,384 A * 9/1997 Park et al. ................... 600/447
5,842,006 A * 11/1998 Harvey et al. ............... 713/502
7,149,274 B2 * 12/2006 Tang ............................. 377/7

FOREIGN PATENT DOCUMENTS

JP 58115375 A * 7/1983
JP 63049906 A * 3/1988

* cited by examiner

*Primary Examiner*—Suresh K Suryawanshi
(74) *Attorney, Agent, or Firm*—Bacon & Thomas, PLLC

(57) ABSTRACT

An addressing type frequency counter circuit is disclosed, which receives a multiple parameter and a clock of addressing input from an external circuit, and uses a hardware address to perform the addressing operation for outputting a clock value, thereby utilizing memory more efficiency, reducing the cost by purchasing less memory to achieve the same performance, and improving integration of the addressing type frequency counter circuit.

12 Claims, 1 Drawing Sheet

ADDRESSING TYPE FREQUENCY COUNTER CIRCUIT

BACKGROUND OF THE INVENTION

1. Field of the Invention

The present invention relates to a frequency counter circuit and, more particularly, to an addressing type frequency counter circuit.

2. Description of Related Art

Currently, CPU is composed of a control unit, an arithmetic and logic unit, and registers. The control unit used to control data transmission of each unit in CPU. Arithmetic and logic unit is composed of an arithmetic unit and a logic unit, for performing arithmetic operation (sum, subtract, multiply, and divide) and logic operation (AND, OR, and NOT) and outputting operation result of the arithmetic and logic unit to the registers. Arithmetic and logic unit comprises a frequency counter wherein as CPU receives a clock from external device, the frequency counter begins counting the clock and outputting a result to CPU. Using CPU to set address to the frequency counter not only wastes the energy but also decreases work efficiency. Therefore, it is desirable to provide an improved circuit to mitigate and/or obviate the aforementioned problems.

SUMMARY OF THE INVENTION

The present invention has been accomplished under the circumstances in view. It is therefore the main object of the present invention to provide an addressing type frequency counter circuit, which uses addressing type data transmission to control data transmission for utilizing memory more efficiency and reducing the cost by purchasing less memory to achieve the same performance. It is another object of the present invention to provide a an addressing type frequency counter circuit, which uses addressing type of data transmission to control data transmission for improving integration of the addressing type frequency counter circuit.

To achieve this and other objects of the present invention, an addressing type frequency counter circuit for receiving a multiple parameter and a clock of addressing input from an external circuit, using a hardware address to perform the addressing operation for outputting a clock value, comprising: a bus; a data acquisition controller electrically connected to the bus, for receiving address and data from the bus; a plurality of control pins, used to control data transmission of the addressing type frequency counter circuit; an addressing type input register, used to save the multiple parameter of addressing input from the external circuit and output the multiple parameter; a Down-counter used to receive the multiple parameter from the addressing type input register and a clock from the external circuit, so as to perform a clock width operation for outputting a clock width value; a clock-width register used to receive and save a clock width value from the Down-counter; an Up-counter for receiving the clock width value from the clock-width register and a local clock, comparing the clock width with the local clock for generating a multiple clock value; a multiple-clock register for receiving and saving a multiple clock value from the multiple clock value; and an addressing type output register for receiving the multiple clock value from the multiple-clock register and outputting to the external circuit.

In addition, each time as the Down-counter performs an operation of clock width value, the Down-counter performs a countdown starting from the multiple parameter until reaching a threshold value. Wherein, each time as the Up-counter performs an operation of multiple clock value, the Up-counter performs a count-up starting from initial value to the multiple parameter and outputs the multiple clock value to the addressing type output register.

The plurality of control pins comprise a ALE pin, a NWR pin, and a NRD pin, using to control data transmission of the bus.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
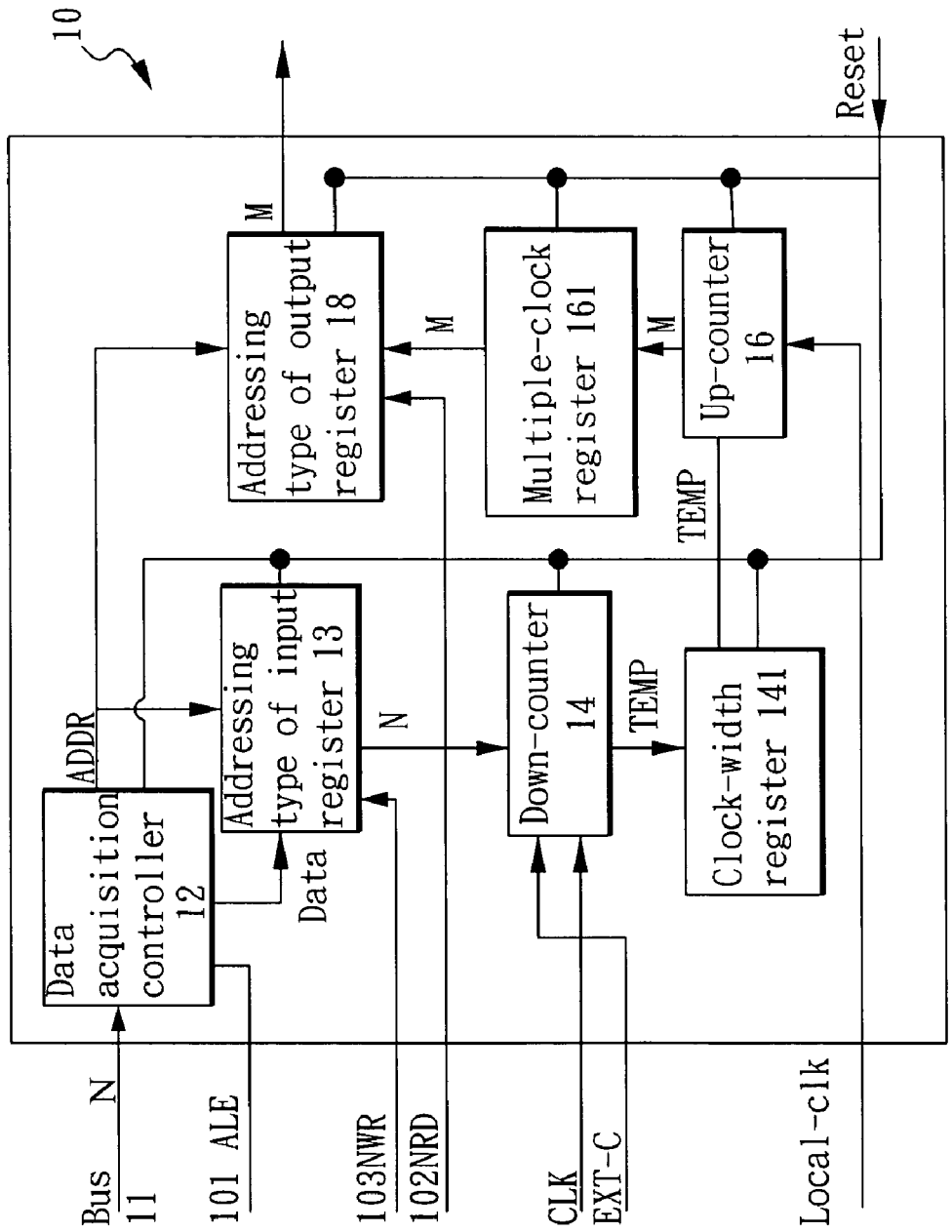
FIG. 1 is a functional diagram of this present invention.

With reference to FIG. 1, an addressing type frequency counter circuit is shown, which is comprised of a bus 11, a data acquisition controller 12, a ALE pin 101, a NRD pin 102, a NWR pin 103, an addressing type input register 13, a Down-counter 14, a clock-width register 141, an Up-counter 16, a multiple-clock register 161, and an addressing type output register 18. In this embodiment, bus 11 is a general bus both used to an address bus and a data bus. Data acquisition controller 12 is electrically connected to the bus 11, used to receive data and address from bus 11. The ALE pin 101, NRD pin 102, and NWR pin 103 are used to control data transmission of addressing type frequency counter circuit 10. The addressing type input register 13 is used to save the multiple parameter N of addressing input from the external circuit. The Down-counter 14 is used to receive the multiple parameter N from the addressing type input register 13 and a clock from the external circuit. The clock-width register 141 is used to receive and save a clock width value TEMP from the Down-counter 14. The Up-counter 16 is used to receive the clock width value TEMP and a local clock (local_clk) and compare the clock width with the local clock to generate a multiple clock value M. The multiple-clock register 161 is used to receive the multiple clock value M from the Up-counter 16. The addressing type output register 18 is used to receive the multiple clock value M and output to an external circuit.

In this embodiment, the bus 11 uses package containing address and data to perform data transmission. The address of the package used to compare with the ALE pin 101, the NRD pin 102, and the NWR pin 103 for determining whether the address of the package is equivalent to the address of the pins, if true, beginning performing data transmission.

In this embodiment, user can set a hardware address of the addressing type frequency counter circuit 10 to perform addressing operation and save the hardware address in a register. When the addressing type frequency counter circuit 10 receives an address signal from the external circuit, the addressing type frequency counter circuit 10 will determine whether the hardware address of the address signal is equivalent to the hardware address of the addressing type frequency counter circuit 10, if true, beginning receiving data from the bus 11.

With reference to FIG. 1, firstly, the addressing type frequency counter circuit 10 must been reset before performing addressing operation in order to confirm the accuracy of the data of the addressing type frequency counter circuit 10. While the external circuit transmits data to the addressing type frequency counter circuit 10 through the bus 11, the data acquisition controller 12 will divide the data of bus 11 into address and data. Furthermore, the addressing type frequency counter circuit 10 transmits the multiple parameter N to the addressing type input register 13 by using the NWR pin 103. In this embodiment, if Down-counter 14 receives the multiple parameter N from the addressing type input register 13 and a clock from the external circuit, Down-counter 14 will begin to perform a clock width operation for outputting a clock width value TEMP to the clock-width register 141. Wherein, each time as the Down-counter 14 calculates a clock width value, the Down-counter 14 performs a countdown starting from the multiple parameter N until reaching a threshold value. In this embodiment, the multiple parameter N is 10, and the threshold value is 0. In this embodiment, the clock-width register 141 synchronously receives the clock width value TEMP from the Down-counter 14 and outputs the clock width value TEMP to the Up-counter 16.

In addition, the Up-counter 16 compares the clock width value M with the local clock for generating a multiple clock value M inputted to the multiple-clock register 161. Wherein, each time as the Up-counter 16 calculates a multiple clock value M, the Up-counter 16 performs a count-up starting from initial value to the multiple parameter N and outputs the multiple clock value M to the addressing type output register 161. The addressing type output register 161 is used to transmit the multiple clock value M to an addressing type of output register 18 for outputting to the external circuit.

Although the present invention has been explained in relation to its preferred embodiment, it is to be understood that many other possible modifications and variations can be made without departing from the spirit and scope of the invention as hereinafter claimed.

What is claimed is:

1. An addressing type frequency counter circuit for receiving a multiple parameter and a clock of addressing input from an external circuit, using a hardware address to perform the addressing operation for outputting a clock value, comprising;

a bus;

a data acquisition controller electrically connected to the bus, for receiving address and data from the bus;

a plurality of control pins, used to control data transmission of the addressing type of frequency counter circuit;

an addressing type input register, used to save the multiple parameter of addressing input from the external circuit and output the multiple parameter;

a Down-counter used to receive the multiple parameter from the addressing type input register and a clock from the external circuit, so as to perform a clock width operation for outputting a clock width value;

a clock-width register used to receive and save a clock width value from the Down-counter;

an Up-counter for receiving the clock width value from the clock-width register and a local clock, comparing the clock width value with the local clock for generating a multiple clock value;

a multiple-clock register for receiving and saving a multiple clock value from the multiple clock value; and an addressing type output register for receiving the multiple clock value from the multiple-clock register and outputting to the external circuit.

2. The circuit as claimed in claim 1, wherein each time as the Down-counter performs an operation of clock width value, the Down-counter performs a countdown starting from the multiple parameter until reaching a threshold value.

3. The circuit as claimed in claim 2, wherein the threshold value of the Down-counter is 0.

4. The circuit as claimed in claim 1, wherein each time as the Up-counter performs an operation of multiple clock value, the Up-counter performs a count-up starting from initial value to the multiple parameter and outputs the multiple clock value to the addressing type output register.

5. The circuit as claimed in claim 4, wherein the initial value of the counter is 0.

6. The circuit as claimed in claim 1, wherein the clock-width register synchronously receives the clock width value from the Down-counter and outputs the clock width value to the Up-counter.

7. The circuit as claimed in claim 1, wherein the plurality of control pins comprise a ALE pin.

8. The circuit as claimed in claim 1, wherein the plurality of control pins comprise a NWR pin.

9. The circuit as claimed in claim 1, wherein the plurality of control pins comprise a NRD pin.

10. The circuit as claimed in claim 1, wherein as the addressing type frequency counter circuit uses the ALE pin to control data transmission of the bus, the data of the bus is an address.

11. The circuit as claimed in claim 1, wherein as the addressing type frequency counter circuit uses the NWR pin to control data transmission of the bus, the data of the bus is inputted to the addressing type frequency counter circuit.

12. The circuit as claimed in claim 1, wherein as the addressing type frequency counter circuit uses the NRD pin to control data transmission of the bus, the data of the bus is outputted from the addressing type frequency counter circuit.

* * * * *